(12) United States Patent
Kimura

(10) Patent No.: US 12,261,569 B2
(45) Date of Patent: Mar. 25, 2025

(54) DEMODULATION DEVICE AND DEMODULATION METHOD

(71) Applicant: FURUNO ELECTRIC CO., LTD., Hyogo (JP)

(72) Inventor: Daisuke Kimura, Ashiya (JP)

(73) Assignee: FURUNO ELECTRIC COMPANY LIMITED, Hyogo (JP)

( * ) Notice: Subject to any disclaimer, the term of this patent is extended or adjusted under 35 U.S.C. 154(b) by 0 days.

(21) Appl. No.: 18/339,134

(22) Filed: Jun. 21, 2023

(65) Prior Publication Data

US 2023/0336124 A1    Oct. 19, 2023

Related U.S. Application Data

(63) Continuation-in-part of application No. PCT/JP2022/000460, filed on Jan. 11, 2022.

(30) Foreign Application Priority Data

Feb. 15, 2021    (JP) .................................. 2021-021996

(51) Int. Cl.
*H03D 3/00* (2006.01)
*H04L 27/00* (2006.01)
(Continued)

(52) U.S. Cl.
CPC ........... *H03D 3/007* (2013.01); *H04L 27/227* (2013.01); *H04L 27/2273* (2013.01);
(Continued)

(58) Field of Classification Search
CPC ....... H04L 2027/0057; H04L 2027/003; H04L 27/2273; H04L 27/233; H04L 27/2332;
(Continued)

(56) References Cited

U.S. PATENT DOCUMENTS 5,566,211 A    10/1996    Choi
6,041,085 A     3/2000    Anzai
(Continued)

FOREIGN PATENT DOCUMENTS

JP    H06-132996 A    5/1994
JP    H10-155005 A    6/1998
(Continued)

OTHER PUBLICATIONS

International Search Report issued in PCT/JP2022/000460; mailed Feb. 22, 2022.
(Continued)

*Primary Examiner* — Ryan Johnson
(74) *Attorney, Agent, or Firm* — Studebaker Brackett PLLC

(57) ABSTRACT

A demodulation device includes a phase rotation module, a phase adjustment module, a phase comparison module, and a reference signal generation module. The phase rotation module rotates phases of an I-Phase signal and a Q-Phase signal in a received signal of a multilevel PSK signal using a reference signal. The phase adjustment module adjusts the phases of the phase rotated I-Phase signal and the phase rotated Q-Phase signal output from the phase rotation module by multiplying the phases of the I-Phase signal and the Q-Phase signal with an integer value to generate a phase adjusted I-Phase signal and a phase adjusted Q-Phase signal. The phase comparison module compares the phase of the phase adjusted I-Phase signal with the phase of the phase adjusted Q-Phase signal to generate a phase comparison result. Also, the reference signal generation module generates a reference signal using the phase comparison result.

18 Claims, 9 Drawing Sheets

(51) Int. Cl.
*H04L 27/227* (2006.01)
*H04L 27/233* (2006.01)
*H04L 27/38* (2006.01)

(52) U.S. Cl.
CPC ........ *H04L 27/233* (2013.01); *H04L 27/3872* (2013.01); *H04L 2027/0057* (2013.01)

(58) Field of Classification Search
CPC ............. H04L 27/3818; H04L 27/3827; H04L 27/3872; H03D 3/007
See application file for complete search history.

(56) References Cited

U.S. PATENT DOCUMENTS

| | | | |
|---|---|---|---|
| 6,363,124 B1* | 3/2002 | Cochran | ............. H04L 27/0014 |
| | | | 329/307 |
| 2003/0026358 A1* | 2/2003 | Kawai | ................. H04L 27/2272 |
| | | | 375/324 |
| 2009/0154590 A1* | 6/2009 | Suzuki | ................. H04L 27/3872 |
| | | | 375/286 |
| 2012/0224657 A1* | 9/2012 | Sasaki | ................. H04L 27/3827 |
| | | | 375/326 |

FOREIGN PATENT DOCUMENTS

| | | |
|---|---|---|
| JP | H11-103327 A | 4/1999 |
| JP | 2013-126224 A | 6/2013 |
| JP | 2018-196000 A | 12/2018 |

OTHER PUBLICATIONS

Extended European Search Report issued in EP 22 75 2493.1-1201 by the European Patent Office on Feb. 4, 2025.

* cited by examiner

| RU | SW | LCID | DS | RD | GD |

RU : RAMP-UP  
SW : SYNCWORD  
LCID : LINK CONFIG ID  
DS : DATA SYMBOL  
RD : RAMP-DOWN  
GD : GUARD TIME

DOUBLE ANGLE PROCESSING

DEMODULATION DEVICE AND DEMODULATION METHOD

CROSS-REFERENCE TO RELATED APPLICATION(S)

This application is a continuation-in-part of PCT International Application No. PCT/JP2022/000460, which was filed on Jan. 11, 2022, and which claims priority to Japanese Patent Application No. 2021-021996 filed on Feb. 15, 2021, the entire disclosures of each of which are herein incorporated by reference for all purposes.

TECHNICAL FIELD

The present disclosure generally relates to a demodulation technique for multilevel (M-Ary) Phase Shift Keying (PSK) modulated signals.

BACKGROUND

Frequency modulation is a process of encoding information in a carrier wave by varying an instantaneous frequency of the carrier wave. Frequency modulation can be analog or digital modulation and is used in various fields, for example, telecommunications, radio broadcasting, signal processing, and computing. In analog frequency modulation of an analog signal (e.g., audio signal), the instantaneous frequency deviation, that is, the difference between the frequency of the carrier and the center frequency, has a functional relation to the modulating signal amplitude. In digital frequency modulation, data can be encoded and transmitted with a type of frequency modulation (e.g., Frequency-Shift Keying (FSK)) for example, in which the instantaneous frequency of the carrier wave is shifted among a set of frequencies.

A Japanese patent document, JP H06132996 A, titled "π/4 shift QPSK demodulating circuit", describes a detection unit for detecting a received π/4 shift QPSK modulated wave by using an output signal of an oscillator. The circuit is equipped with a phase-rotating unit that rotates a phase of an I-channel signal and a Q-channel signal output from the detection unit. A phase comparison unit compares the phases of the I-channel signal and the Q-channel signal output from a phase-rotating unit and outputs a detection amount including phase difference information between the π/4 shift QPSK modulated wave and the oscillator output signal. A control amount generation unit generates a control amount that sequentially increases based on the detection amount from the phase comparison unit, and a control output from the control amount generation unit. A phase rotation amount generation unit generates a phase rotation amount of the phase rotation unit based on the amount and supplies the phase rotation amount to the phase rotation unit, and a phase rotation amount input to the phase rotation unit for each symbol period. The phase rotation amount changing unit changes the inputted phase rotation amounts in turn by each π/4 at every one symbol period.

However, in such demodulation circuit, it is difficult to demodulate multilevel PSK signals such as 8PSK.

SUMMARY

In order to solve the foregoing problem and to provide other advantages, one aspect of the present disclosure is to provide a demodulation device equipped with a phase rotation module, a phase adjustment module, a phase comparison module, and a reference signal generation module. The phase rotation module rotates the phases of an I-Phase signal and a Q-Phase signal in a received signal of a multilevel PSK signal using a reference signal. The phase adjustment module adjusts the phases of the phase rotated I-Phase signal and the phase rotated Q-Phase signal output from the phase rotation module by multiplying the phases of the I-Phase signal and the Q-Phase signal with an integer value to generate a phase adjusted I-Phase signal and a phase adjusted Q-Phase signal. The phase comparison module compares the phase of the phase-adjusted I-Phase signal with the phase of the phase-adjusted Q-Phase signal to generate a phase comparison result. The reference signal generation module generates the reference signal using the phase comparison result.

An advantage of various embodiments is to provide in multilevel PSK, a constant phase difference (angular difference) between symbols adjacent to the rotational direction of the phase. In this configuration, by setting the phase adjustment amount to be the predetermined value being multiplied by integer times, the phase difference (angular difference) between symbols adjacent to the rotational direction of the phase after the phase adjustment is adjusted to 45 degrees. Therefore, even a multilevel PSK such as 8 PSK, for example, can realize frequency adjustment of the reference signal in the same way as QPSK.

An object of the present disclosure is to more reliably realize the demodulation of multilevel PSK signals.

A demodulation device includes a phase rotation module, a phase adjustment module, a phase comparison module, and a reference signal generation module. The phase rotation module is configured to rotate phases of an I-Phase signal and a Q-Phase signal in a received signal of a multilevel PSK signal using a reference signal. The phase adjustment module is configured to adjust the phases of the phase rotated I-Phase signal and the Q-Phase signal output from the phase rotation module by multiplying the phases of the I-Phase signal and the Q-Phase signal with an integer value to generate a phase adjusted I-Phase signal and a phase adjusted Q-Phase signal. The phase comparison module is configured to compare the phase of the phase-adjusted I-Phase signal with the phase of the phase-adjusted Q-Phase signal to generate a phase comparison result. The reference signal generation module is configured to generate a reference signal using the phase comparison result.

In an aspect, the demodulation device further includes an integration module configured to integrate the phase comparison result to generate an integral value. The reference signal generation module is further configured to generate the reference signal using the integral value.

In an aspect, the demodulation device further includes a gain control module configured to adjust a gain of the phase comparison result to generate a gain-adjusted phase comparison result. The integration module is further configured to integrate the gain-adjusted phase comparison result.

In an aspect, the phase adjustment module is further configured to vary the integer value.

In an aspect, a demodulation method includes rotating phases of an I-Phase signal and a Q-Phase signal in a received signal of a multilevel PSK signal using a reference signal. The method further includes adjusting the phases of the phase rotated I-Phase signal and the phase rotated Q-Phase signal output from the phase rotation module by multiplying the phases of the phase rotated I-Phase signal and the phase rotated Q-Phase signal with an integer value to generate a phase adjusted I-Phase signal and a phase adjusted Q-Phase signal. The method further includes comparing the phase of the phase-adjusted I-Phase signal with the phase of the phase-adjusted Q-Phase signal to generate a phase comparison result. The method further includes generating a reference signal using the phase comparison result.

In an aspect, the demodulation method further includes integrating the phase comparison result to generate an integral value and generating the reference signal using the integral value.

In an aspect, the demodulation method further includes adjusting a gain of the phase comparison result to generate a gain-adjusted phase comparison result and integrating the gain-adjusted phase comparison result.

In an aspect, the demodulation method further includes varying the integer value.

Effect(s)

According to this disclosure, the demodulation of multi-level PSK signals can be more reliably realized.

BRIEF DESCRIPTION OF THE DRAWINGS

The following detailed description of illustrative embodiments is better understood when read in conjunction with the appended drawings. For the purpose of illustrating the present disclosure, exemplary constructions of the disclosure are shown in the drawings. However, the present disclosure is not limited to a specific device, or a tool and instrumentalities disclosed herein. Moreover, those skilled in the art will understand that the drawings are not to scale.

Figure 1:
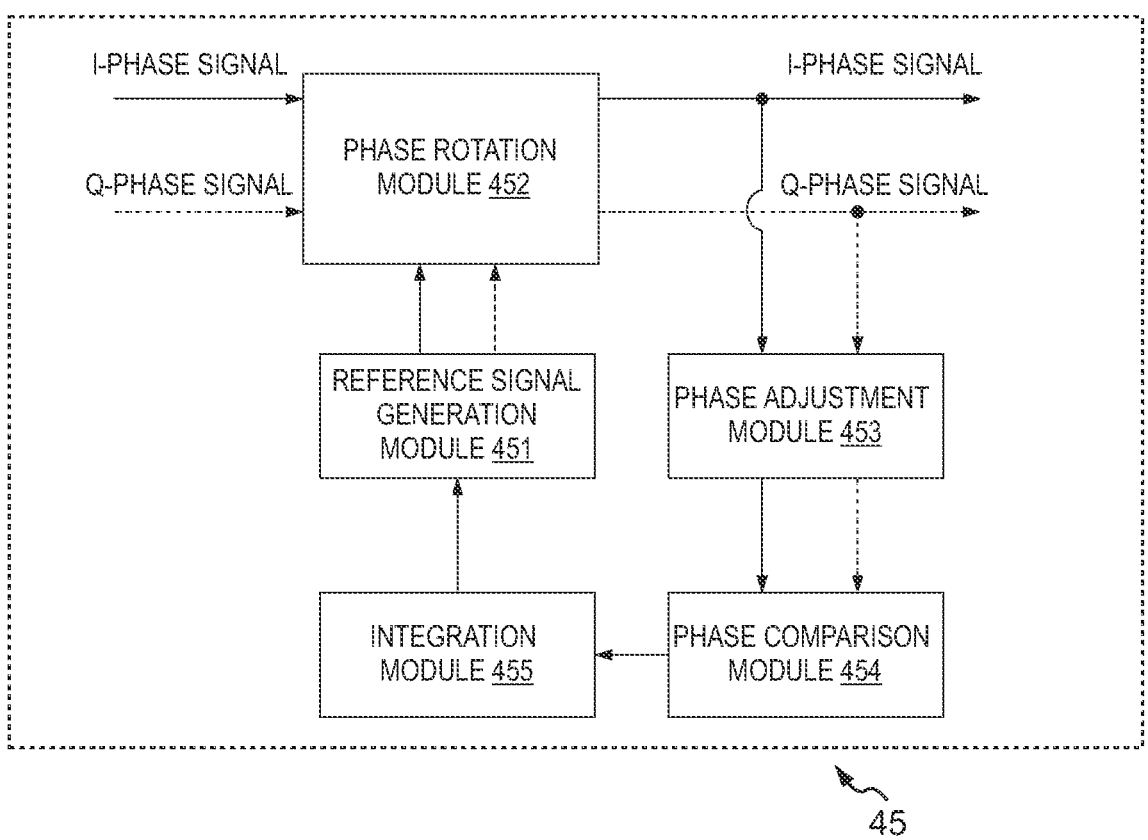
FIG. 1 is a functional block diagram of a demodulation device according to an embodiment of the present disclosure.

The drawings referred to in this description are not to be understood as being drawn to scale except if specifically noted, and such drawings are only exemplary in nature.

DETAILED DESCRIPTION OF THE DISCLOSURE

In the following description, for purposes of explanation, numerous specific details are set forth in order to provide a thorough understanding of the present disclosure. It will be apparent, however, to one skilled in the art that the present disclosure can be practiced without these specific details. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments described herein. Accordingly, the examples should not be construed as limiting the scope of the embodiments herein.

Reference in this specification to "one embodiment" or "an embodiment" means that a particular feature, structure, or characteristic described in connection with the embodiment is included in at least one embodiment of the present disclosure. The appearances of the phrase "in an embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

Moreover, although the following description contains many specifics for the purposes of illustration, anyone skilled in the art will appreciate that many variations and/or alterations to said details are within the scope of the present disclosure. Similarly, although many of the features of the present disclosure are described in terms of each other, or in conjunction with each other, one skilled in the art will appreciate that many of these features can be provided independently of other features. Accordingly, this description of the present disclosure is set forth without any loss of generality to, and without imposing limitations upon, the present disclosure.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores, or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processor. The processor can be a microprocessor, but in the alternative, the processor can be a controller, microcontroller, or state machine, combinations of the same, or the like. The processor can include electrical circuitry configured to process computer-executable instructions. In another embodiment, the processor includes an Application Specific Integrated Circuit (ASIC), a Field Programmable Gate Array (FPGA) or other programmable device that performs logic operations without processing computer-executable instructions. The processor can also be implemented as a combination of computing devices, e.g., a combination of a Digital Signal Processor (DSP) and a microprocessor, a plurality of microprocessors, one or more microprocessors in conjunction with a DSP core, or any other such configuration. Although described herein primarily with respect to digital technology, the processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may." unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements, or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B, and C" can include a first processor configured to carry out recitation A working in conjunction with a second processor configured to carry out recitations B and C. The same holds true for the use of definite articles used to introduce embodiment recitations. In addition, even if a specific number of an introduced embodiment recitation is explicitly recited, those skilled in the art will recognize that such recitation should typically be interpreted to mean at least the recited number (e.g., the bare recitation of "two recitations," without other modifiers, typically means at least two recitations, or two or more recitations).

It will be understood by those within the art that, in general, terms used herein, are generally intended as "open" terms (e.g., the term "including" should be interpreted as "including but not limited to," the term "having" should be interpreted as "having at least," the term "includes" should be interpreted as "includes but is not limited to," etc.).

As used herein, the terms "attached," "connected," "mated" and other such relational terms should be construed, unless otherwise noted, to include removable, moveable, fixed, adjustable, and/or releasable connections or attachments. The connections/attachments can include direct connections and/or connections having intermediate structure between the two components discussed.

It should be emphasized that many variations and modifications may be made to the above-described embodiments, the elements of which are to be understood as being among other acceptable examples. All such modifications and variations are intended to be included herein within the scope of this disclosure and protected by the following claims.

Various embodiments of the present disclosure relate to a demodulation technique for multilevel (M-Ary) Phase Shift Keying (PSK) modulated signals. Various embodiments of the present disclosure are described hereinafter with reference to FIG. 1 to FIG. 10A.

Figure 2:
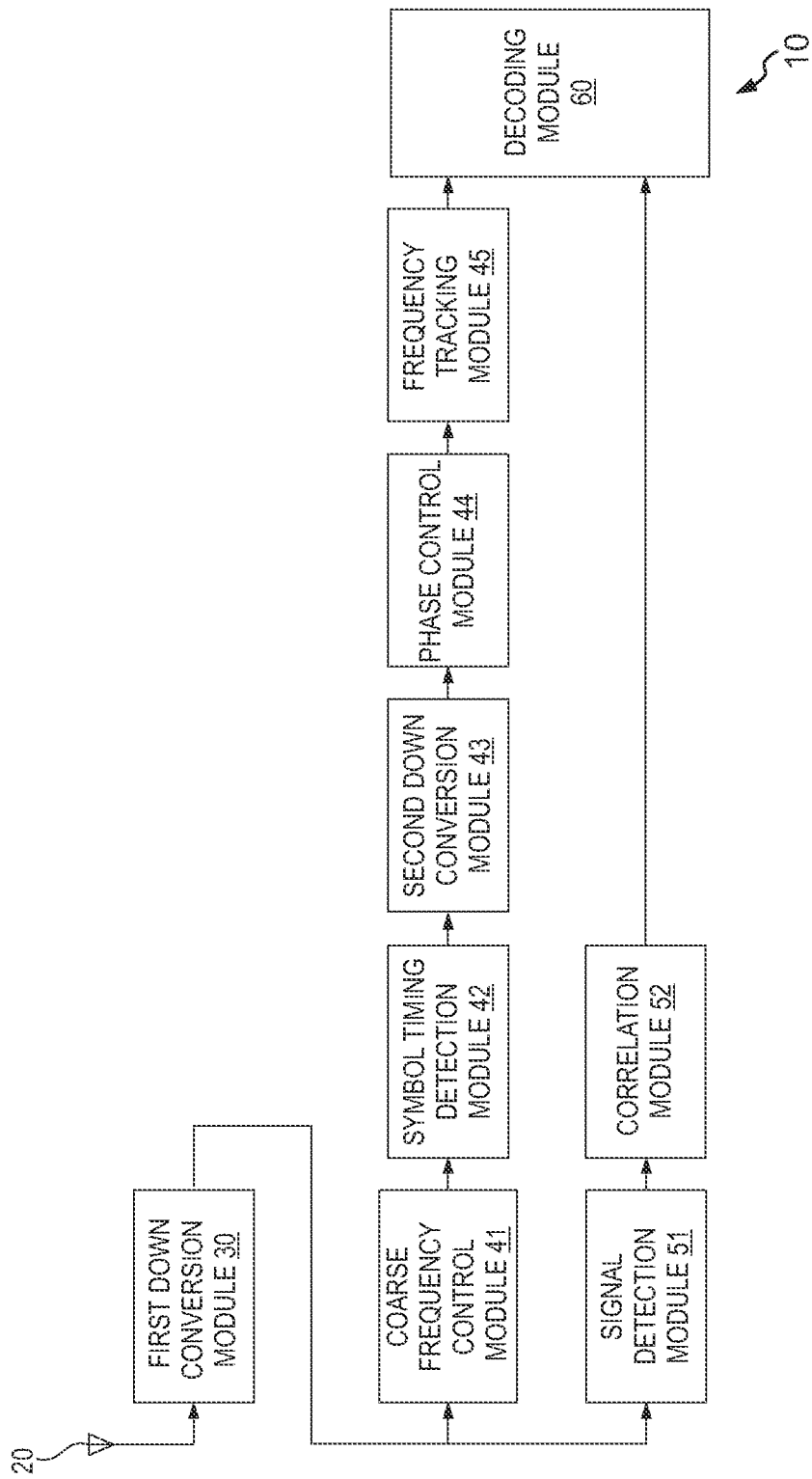
FIG. 2 is a functional block diagram of an Automatic Identification System (AIS) device according to an embodiment of the present disclosure.
Figures 3, 4:
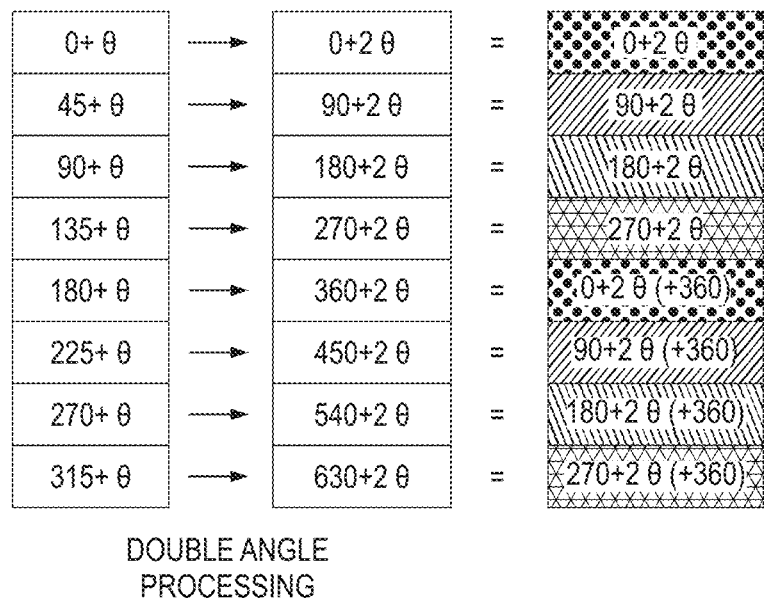
FIG. 3 is a diagram showing an example of the data structure of a signal for an AIS.
FIG. 4 is a diagram showing the phase transition concept adjusted by a phase adjustment module.

Configuration and Processing of Frequency Tracking Module:

Demodulation technology according to a first embodiment of the present disclosure will be described with reference to the figures. FIG. 1 is a functional block diagram of a demodulation device according to the first embodiment of the present disclosure. FIG. 2 is a functional block diagram of an Automatic Identification System (AIS) device according to the first embodiment of the present disclosure. FIG. 3 is a diagram showing an example of the data structure of the AIS signal.

As shown in FIG. 1, the demodulation device 45 (hereinafter interchangeably referred to as "frequency tracking module 45") includes a Voltage-Controlled Oscillator (VCO) 451 (hereinafter interchangeably referred to as "reference signal generation module 451"), a phase rotation module 452, a phase adjustment module 453, a phase comparison module 454, and an integration module 455. The VCO 451 is synonymously referred to as "reference signal generation module 451" of the present disclosure. The reference signal generation module 451 adjusts a frequency of a reference signal using an integral value of a phase comparison result received from the integration module 455 to generate a frequency-adjusted reference signal. The reference signal generation module 451, the phase rotation module 452, the phase adjustment module 453, the phase comparison module 454, and the integration module 455 can be realized by an arithmetic processing unit or processing circuitry 499 such as a personal computer or a dedicated electronic circuit.

The reference signal generation module 451 then generates an I-Phase reference signal and a Q-Phase reference signal from the frequency-adjusted reference signal. An I-Phase signal and a Q-Phase signal of a received signal are input to the phase rotation module 452 along with the I-Phase reference signal and the Q-Phase reference signal from the reference signal generation module 451. The I-Phase signal and the Q-Phase signal of the received signal are generated, for example, by quadrature detection of the received signal.

The phase rotation module 452 rotates phases of the I-Phase signal and the Q-Phase signal using the I-Phase reference signal and the Q-Phase reference signal. The phase rotated I-Phase signal and the phase rotated Q-Phase signal from the phase rotation module 452 are output to the decoding module 60 (See FIG. 2) and also to the phase adjustment module 453.

The phase adjustment module 453 adjusts the phase of the phase rotated I-Phase signal and the phase of the phase rotated Q-Phase signal. More specifically, the phase adjustment module 453 uses the "double-angle formula" to adjust the phase of the phase rotated I-Phase signal and the phase of the phase rotated Q-Phase signal. The phase adjustment module 453 multiplies the phases of the phase rotated I-Phase signal and the phase rotated Q-Phase signal with an integer value to generate a phase adjusted I-Phase signal and a phase adjusted Q-Phase signal.

The phase comparison module 454 compares the phase of the I-Phase signal after phase adjustment with the phase of the Q-Phase signal after phase adjustment. More specifically, the phase comparison module 454 calculates the phase difference between the I-Phase signal after phase adjustment and the Q-Phase signal after phase adjustment to generate a phase comparison result. The phase comparison module 454 outputs the phase comparison result to the integration module 455.

As shown in FIG. 2, the AIS device 10 (for example, a universal shipborne) includes an antenna 20, a first down-conversion module 30, a coarse frequency control module 41, a symbol timing detection module 42, a second down-conversion module 43, a phase control module 44, a signal detection module 51 and a correction module 52. The first down-conversion module 30 down-converts the received signal to a frequency (For example, 10 times the frequency) that is a predetermined multiple of the baseband signal. The first down-conversion module 30 outputs the down-converted received signal to the coarse frequency control module 41 and the signal detection module 51.

A coarse frequency control module 41 estimates and calculates the frequency deviation from the received signal and performs coarse frequency control. By the processing of the coarse frequency control module 41, for example, the frequency of the reference signal is driven from a range of +/−500 Hz to a range of +/−30 Hz relative to the frequency of the received signal.

The symbol timing detection module 42 detects symbol timing for the received signal after the coarse control output from the coarse frequency control module 41. The second down-conversion module 43 down-converts the output signal of the symbol timing detection module 42 to the baseband frequency. The phase control module 44 performs automatic phase control on the signal down converted to the baseband (baseband signal).

The frequency tracking module 45 (or the demodulation device 45) performs automatic phase control and automatic frequency control with higher accuracy on the baseband signal output from the phase control module 44. This forces the frequency of the reference signal from a range of +/−500 Hz to a range of +/−30 Hz relative to the frequency of the received signal. Therefore, convergence to the desired symbol point can be achieved with high accuracy. The frequency tracking module 45 outputs the signal (demodulated signal) after the automatic phase control and the automatic frequency control to the decoding module 60. Specific details of the automatic phase control and the automatic frequency control performed by the frequency tracking module 45 will be described later. The frequency tracking module 45 corresponds to the "demodulation device 45" of the present disclosure.

The signal detection module 51 detects RU (Ramp-Up) data of the received signal. The correlation module 52 uses the timing of the RU data to perform correlation processing between the received signal and the reference code. The correlation module 52 outputs the correlation result to the decoding module 60. Using the demodulation signal and the timing of detection of the main lobe of the correlation result (peak detection timing), the decoding module 60 decodes data including various information for an AIS such as a ship identification ID from Data Symbol (DS) data.

As shown in FIG. 3, the signal for an AIS is composed of the RU data, Syncword (SW) data, Link Configuration Identity (LCID) data, the DS data, Ramp-Down (RD) data and Guard Time (GD) data.

The RU data, SW data, LCID data, DS data, RD data and GD data are arranged in this order. The RU data, SW data, LCID data, DS data and RD data are respectively data of a prescribed number of bits and a prescribed bit array. The RU data, SW data and LCID data are signals that are, for example, π/4 Quadrature Phase Shift Keying (QPSK) modulated. DS data are signals modulated by 8 Phase Shift Keying (PSK) or 16 Quadrature Amplitude Modulation (QAM).

The RU data is data representing the beginning of data for AIS signals. The SW data is data for timing detection and frequency control. The LCID data is data representing the modulation scheme of DS data. The DS data is data including various information for an AIS such as ship identification ID. The RD data is data for AIS signals, more specifically data representing the end of DS data. The GD data is a time interval left vacant, having no signal or data, during which no data is sent.

FIG. 4 shows the transition concept of the phase adjusted by the phase adjustment module 453. In FIG. 4, θ represents the amount of phase shift. FIG. 4 further shows the case of an 8PSK modulated signal. In 8PSK, the phase difference (angular difference) of symbol points adjacent to the rotation direction of the phase is π/4 (rad) and 45 (deg).

Therefore, as shown in FIG. 4, when phase adjustment is performed by the phase adjustment module 453, the point of 0+θ (deg) is adjusted to 0+2θ (deg). The point of 45+θ (deg) is adjusted to 90+2θ (deg), the point of 90+θ (deg) is adjusted to 180+2θ (deg), and the point of 135+θ (deg) is adjusted to 270+2θ (deg). The point of 180+θ (deg) is adjusted to 360+2θ (deg), and the point of 225+θ (deg) is adjusted to 450+2θ (deg). The point of 270+θ (deg) is adjusted to 540+2θ (deg), and the point of 315+θ (deg) is adjusted to 630+2θ (deg).

Here, 360+2θ [deg] is 0+2θ (+360) [deg], 450+2θ (deg) is 90+2θ (+360) [deg], 540+2θ (deg) is 180+2θ (+360) [deg], and 630+2θ (deg) is 270+2θ (+360) [deg].

Therefore, the phase difference of symbol points adjacent to the phase rotation direction after the phase adjustment is 90 degrees. That is, even at 8 PSK, the phase difference of adjacent symbol points on I-Q Coordinates is the same as QPSK. Thus, the processing after the phase comparison module 454 can use a processing circuit for QPSK consisting of a known simple configuration. As a result, the frequency tracking module 45 can realize high-precision phase control and frequency control similar to the tracking processing for QPSK. The phase adjustment module 453 outputs the phase adjusted I-Phase signal after phase adjustment and the phase adjusted Q-Phase signal after phase adjustment to the phase comparison module 454.

The phase comparison module 454 compares the phase of the phase adjusted I-Phase signal with the phase of the phase adjusted Q-Phase signal. More specifically, the phase comparison module 454 calculates the phase difference between the phase adjusted I-Phase signal and the phase adjusted Q-Phase signal to generate a phase comparison result. The phase comparison module 454 outputs the phase comparison result to the integration module 455.

The integration module 455 integrates the phase comparison result (the phase difference between the phase adjusted I-Phase signal and the phase adjusted Q-Phase signal) over a predetermined period of time to generate the integral value and outputs the integral value to the VCO 451 (or the reference signal generation module 451).

The VCO 451 uses the integral value to adjust the phase and the frequency of the reference signal and outputs the phase and frequency adjusted reference signal to the phase rotation module 452.

By repeating the above processing, the phase and frequency of the I and Q-Phase signals output from the phase rotation module 452 are driven to high accuracy. Therefore, convergence to the desired symbol point can be realized with high accuracy.

Figure 5A:
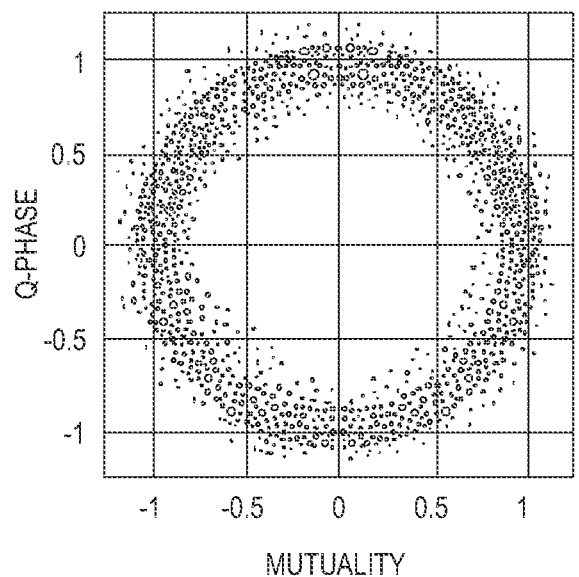
FIG. 5A shows the pre-tracking constellation according to a first embodiment of the present disclosure.
Figure 5B:
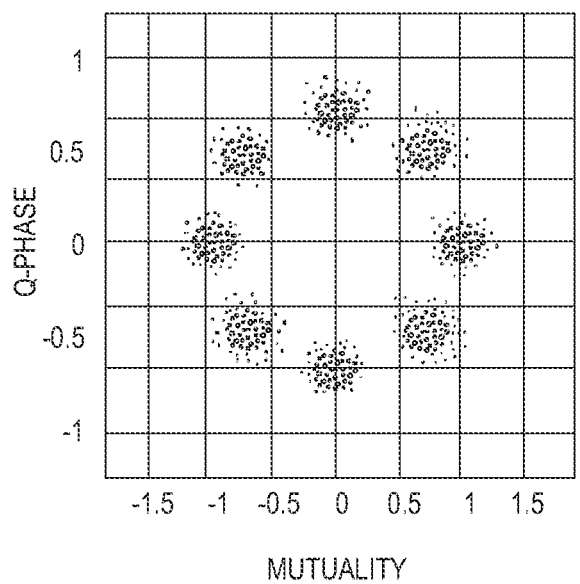
FIG. 5B shows the post-tracking constellation according to the first embodiment of the present disclosure.

FIG. 5A shows the pre-tracking constellation according to the first embodiment of the present disclosure, and FIG. 5B shows the post-tracking constellation according to the first embodiment of the present disclosure. FIG. 5A and FIG. 5B show the case where the frequency deviation is 30 Hz.

As shown in FIG. 5A and FIG. 5B symbol points can be detected with high precision by executing the processing of the frequency tracking module 45.

Thus, the frequency tracking module 45 can more reliably demodulate the 8 PSK signal. Moreover, the frequency tracking module 45 can demodulate the 8 PSK signal with high accuracy.

Demodulation Method

Figure 6:
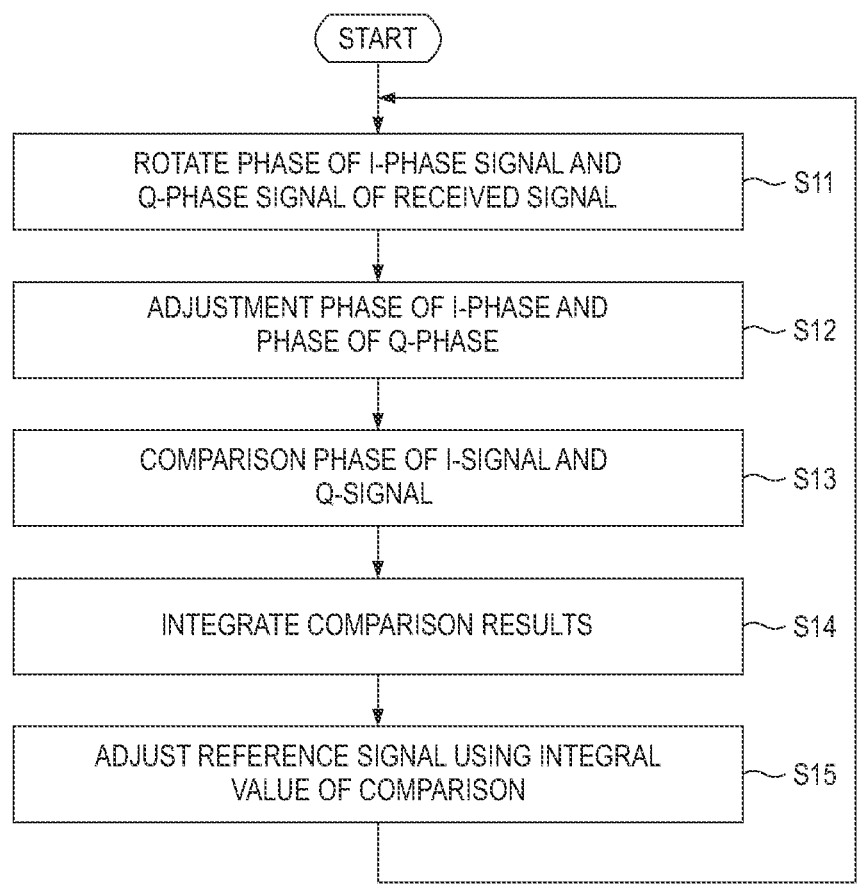
FIG. 6 is a flow chart showing an example of the demodulation method according to an embodiment of the present disclosure.

FIG. 6 is a flow chart showing an example of a demodulation method according to an embodiment of the present disclosure. It should be noted that in the specific contents of each process of the flow chart shown in FIG. 6, each module described by the explanation of the above configuration is omitted from the explanation below.

At step S11, the frequency tracking module 45 uses the reference signal (I-Phase reference signal and Q-Phase reference signal) to rotate the phases of the I-Phase signal and the Q-Phase signal of the received signal. At the beginning of the phase adjustment processing, the reference signal (I-Phase reference signal and Q-Phase reference signal) is set to a predetermined value, for example, assuming that there is no frequency deviation.

At step S12, the frequency tracking module 45 adjusts the phases of the phase rotated I-Phase signal and the phase rotated Q-Phase signal to generate the phase adjusted I-Phase signal and the phase adjusted Q-Phase signal. In one embodiment, the phase adjustment is processing to double the phase using, for example, the "double-angle formula".

At step S13, the frequency tracking module 45 compares the phases of the phase adjusted I-Phase signal and the phase adjusted Q-Phase signal to generate the phase comparison result. The phase comparison processing is, for example, processing for calculating the phase difference.

At step S14, the frequency tracking module 45 integrates the phase comparison result to generate the integral value. The integration of the comparison results is, for example, the integral value of phase differences.

At step S15, the frequency tracking module 45 generates the reference signal using the phase comparison result. In other words, the frequency tracking module 45 performs phase adjustment and frequency adjustment of the reference signal using the integral value of the comparison results.

Hereafter, the frequency tracking module 45 repeatedly executes the processing from step S11 to step S15.

Figure 7:
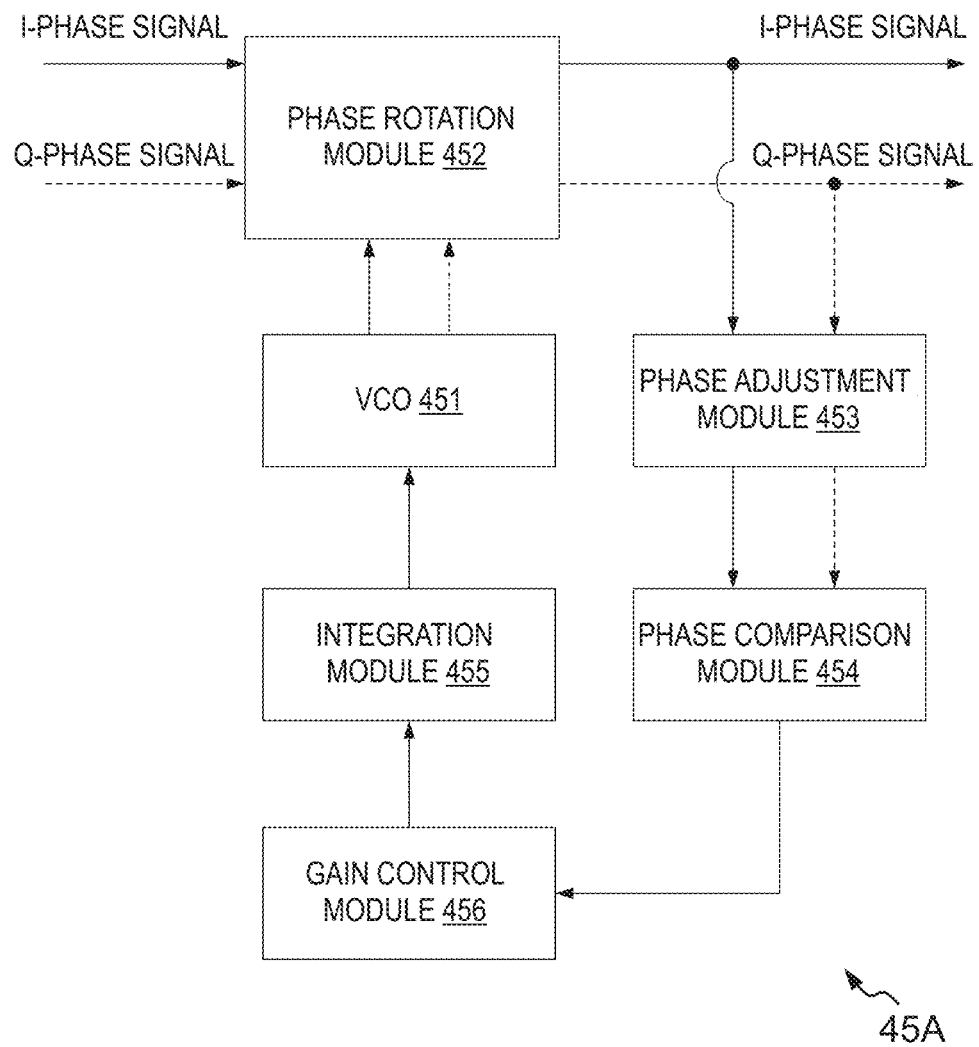
FIG. 7 is a functional block diagram of the demodulation device according to a second embodiment of the present disclosure.

Demodulation technology according to a second embodiment of the present disclosure will be described with reference to the figures. FIG. 7 is a functional block diagram of the frequency tracking module according to a second embodiment of the present disclosure.

The demodulation technology of the second embodiment differs from the demodulation technology of the first embodiment in that the demodulation technology includes a frequency tracking module 45A (hereinafter interchangeably referred to as "demodulation device 45A"). The other contents of the demodulation technology of the second embodiment are the same as those of the demodulation technology of the first embodiment, and each description of the same modules is omitted.

The frequency tracking module 45A differs from the frequency tracking module 45 of the first embodiment in that it includes a gain control module 456. The other configuration of the frequency tracking module 45A is the same as that of the frequency tracking module 45, and each description of the same modules is omitted.

Comparison results (for example, the phase comparison result) are input to the gain control module 456 from the phase comparison module 454. The gain control module 456 adjusts a gain of the phase comparison result and outputs a gain-adjusted phase comparison result to the integration module 455. The integration module 455 integrates the gain-adjusted phase comparison result.

In this configuration, the frequency tracking module 45A can detect symbol points with high precision. Furthermore, gain adjustment is performed by the gain control module 456, so that the phase comparison result (phase difference) is corrected to a value appropriate for tracking. Thus, the frequency tracking module 45A can detect the symbol point more reliably and with higher accuracy.

Figure 8:
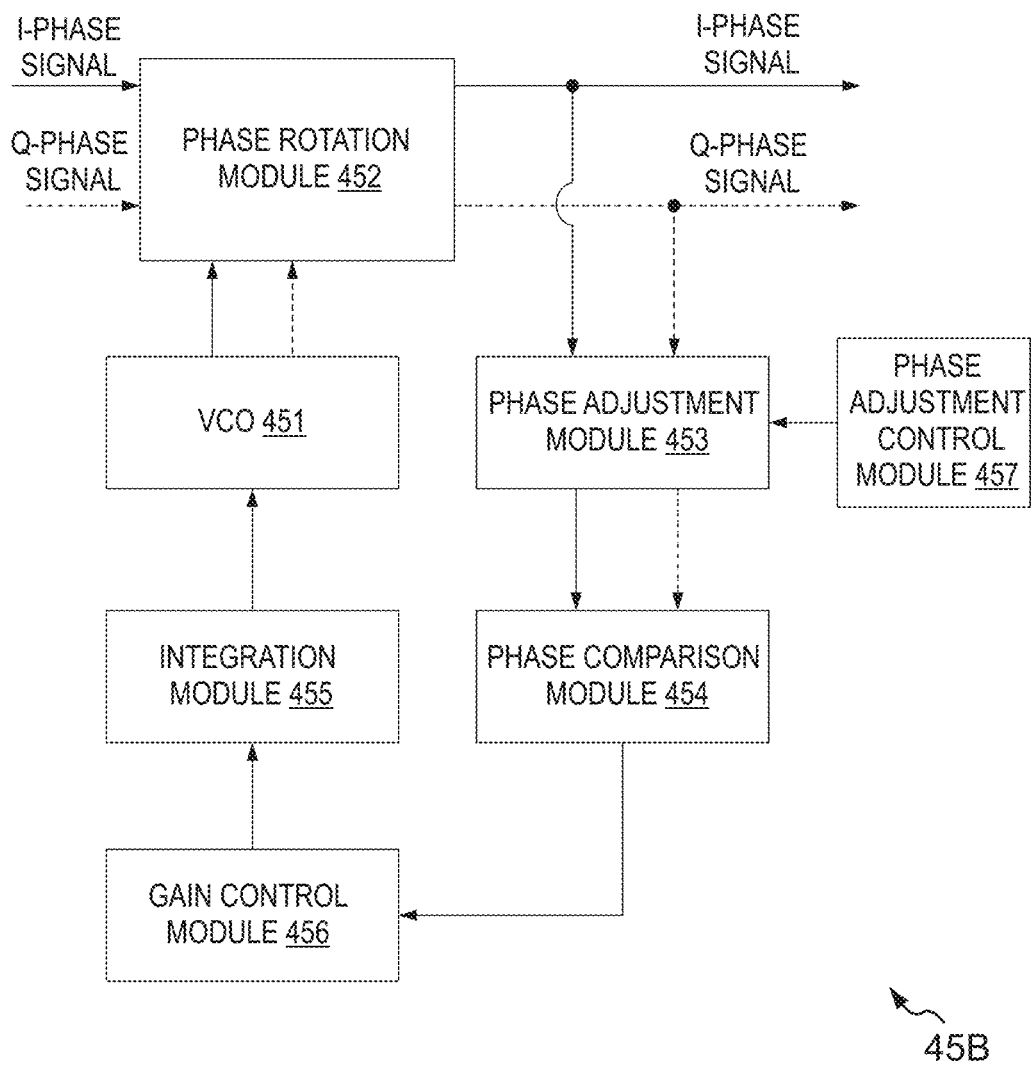
FIG. 8 is a functional block diagram of the demodulation device according to a third embodiment of the present disclosure.

Demodulation technology according to a third embodiment of the present disclosure will be described with reference to the figures. FIG. 8 is a functional block diagram of the frequency tracking module according to a third embodiment of the present disclosure.

The demodulation technology according to the third embodiment differs from the demodulation technology according to the second embodiment in that a frequency tracking module 45B (hereinafter interchangeably referred to as "demodulation device 45B") is provided. The other contents of the demodulation technology according to the third embodiment are the same as those of the demodulation technology according to the third embodiment, and each description of the same modules is omitted.

The frequency tracking module 45B differs from the frequency tracking module 45A according to the second embodiment in that it has a phase adjustment control module 457. The other configuration of the frequency tracking module 45B is the same as that of the frequency tracking module 45A, and each description of the same modules is omitted.

The phase adjustment control module 457 sets an adjustment amount of the phase to the phase adjustment module 453. More specifically, the phase adjustment control module 457 sets the number of iterations of the phase adjustment using, for example, the "double-angle formula". For example, if the received signal is 8 PSK, the phase adjustment control module 457 sets the phase adjustment module 453 to perform the phase adjustment using the "double-angle formula" once. If the received signal is 16 PSK, the phase adjustment control module 457 sets the phase adjustment module 453 to perform the phase adjustment using the "double-angle formula" twice. If the received signal is 32 PSK, the phase adjustment control module 457 sets the phase adjustment module 453 to perform the phase adjustment using the "double-angle formula" three times.

The phase adjustment module 453 performs phase adjustment according to the number of times set by the phase adjustment control module 457.

In this configuration, the frequency tracking module 45B can detect symbol points with high accuracy. Furthermore, by using this configuration and processing, the frequency tracking module 45B can detect symbol points of not only 8 PSK but also other multilevel PSK signals such as 16 PSK, 32 PSK, etc., with high accuracy.

Figure 9A:
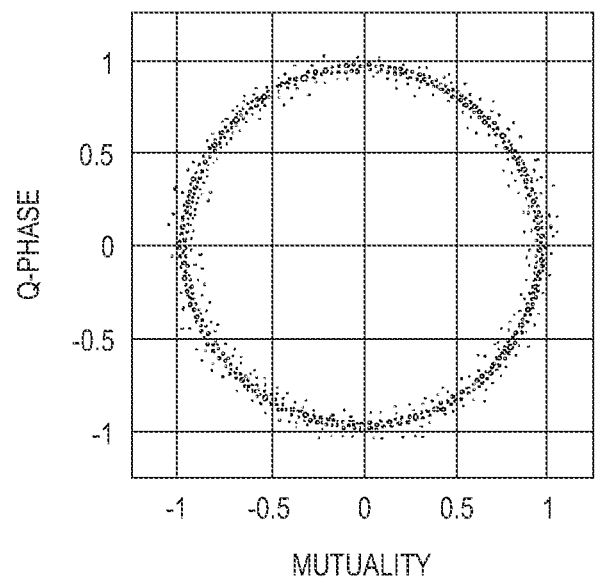
FIG. 9A shows the pre-tracking constellation for the 16 PSK signal according to the third embodiment of the present disclosure.
Figure 9B:
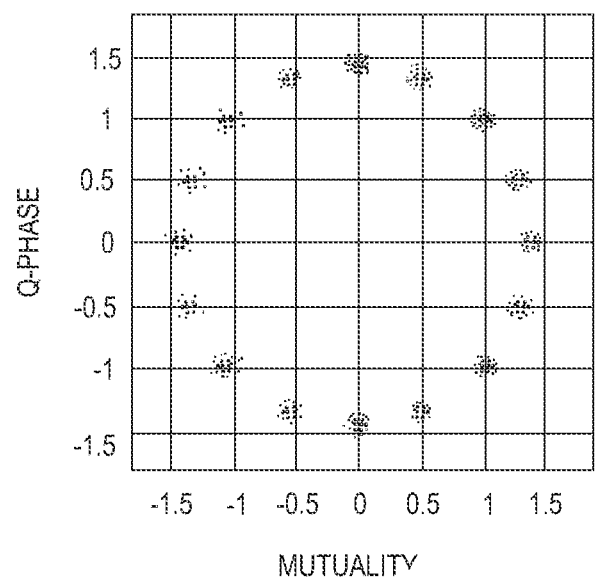
FIG. 9B shows the post-tracking constellation for the 16 PSK signal according to the third embodiment of the present disclosure.

FIG. 9A shows the pre-tracking constellation for the 16 PSK signal according to the third embodiment of the present disclosure, and FIG. 9B shows the post-tracking constellation for the 16 PSK signal according to the third embodiment of the present disclosure. FIG. 9A and FIG. 9B show the case where the frequency deviation is 30 Hz.

As shown in FIG. 9A and FIG. 9B, symbol points can be detected with high precision by executing the processing of the frequency tracking module 45B.

Figure 10A:
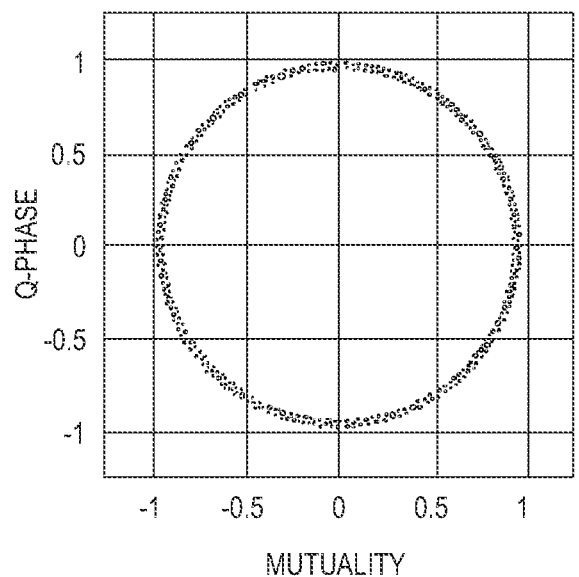
FIG. 10A shows the pre-tracking constellation for the 32 PSK signal according to the third embodiment of the present disclosure.
Figure 10B:
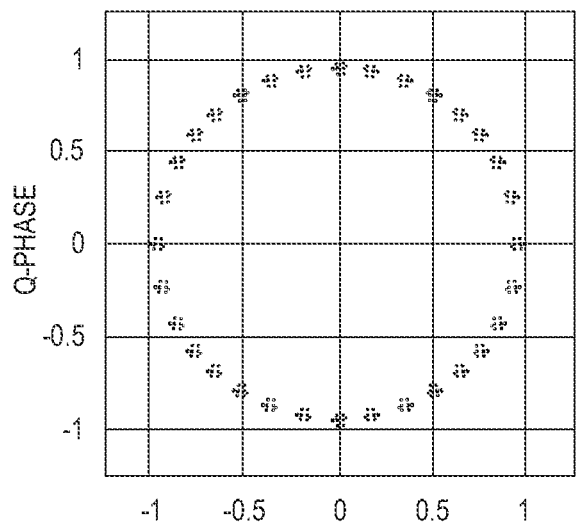
FIG. 10B shows the post-tracking constellation for the 32 PSK signal according to the third embodiment of the present disclosure.

FIG. 10A shows the pre-tracking constellation for the 32 PSK signal according to the third embodiment of the present disclosure, and FIG. 10B shows the post-tracking constellation for the 32 PSK signal according to the third embodiment of the present disclosure. FIG. 10A and FIG. 10B show the case where the frequency deviation is 30 Hz.

As shown in FIG. 10A and FIG. 10B, symbol points can be detected with high precision by executing the processing of the frequency tracking module 45B.

The QPSK signal can also be demodulated when the phase adjustment control module 457 does not perform phase adjustment by the phase adjustment module 453, that is, sets the number of phase adjustments to zero.

Thus, the frequency tracking module 45B can more reliably demodulate multiple types of multilevel PSK signals. Moreover, the frequency tracking module 45B can demodulate multiple types of multilevel PSK signals with high accuracy.

DESCRIPTION OF REFERENCE CHARACTERS

10: UAIS/AIS/(Universal Shipborne) Automatic Identification System
20: Antenna
30: First Down Conversion Module (Down Converter)
41: Coarse Frequency Control Module (Coarse Frequency Controller)
42: Symbol Timing Detection Module (Symbol Timing Detector)
43: Second Down Conversion Module (Down Converter)
44: Phase Control Module (Phase Controller)
45, 45A, 45B: Frequency Tracking Module (Frequency Tracker)
51: Signal Detection Module (Signal Detector)
52: Correlation Module (Correlator)
60: Decoding Module (Decoder)
451: Reference Signal Generation Module (VCO)
452: Phase Rotation Module
453: Phase Adjustment Module
454: Phase Comparison Module
455: Integration Module (Integrator)
456: Gain Control Module (Gain Controller)
457: Phase Adjustment Control Module (Phase Adjustment Controller)

What is claimed is:

1. A demodulation device comprising:
processing circuitry configured:
to rotate phases of an I-Phase signal and a Q-Phase signal in a received signal of a multilevel PSK signal using a reference signal;
to adjust the phases of the phase rotated I-Phase signal and the phase rotated Q-Phase signal by multiplying the phases of the phase rotated I-Phase signal and the phase rotated Q-Phase signal with an integer value to generate a phase adjusted I-Phase signal and a phase adjusted Q-Phase signal;
to compare the phase of the phase adjusted I-Phase signal with the phase of the phase adjusted Q-Phase signal to generate a phase comparison result; and
to generate a reference signal using the phase comparison result.

2. The demodulation device according to claim 1, wherein:
the processing circuitry is further configured:
to integrate the phase comparison result to generate an integral value; and
to generate the reference signal using the integral value.

3. The demodulation device according to claim 2, wherein:
the processing circuitry is further configured:
to adjust a gain of the phase comparison result to generate a gain-adjusted phase comparison result; and
to integrate the gain-adjusted phase comparison result.

4. The demodulation device according to claim 1, wherein:
the processing circuitry is further configured to vary the integer value.

5. The demodulation device according to claim 2, wherein:
the processing circuitry is further configured to vary the integer value.

6. The demodulation device according to claim 3, wherein:
the processing circuitry is further configured to vary the integer value.

7. A demodulation method, comprising:
rotating phases of an I-Phase signal and a Q-Phase signal in a received signal of a multilevel PSK signal using a reference signal to generate a phase-rotated I-Phase signal and a phase-rotated Q-Phase signal;
adjusting the phases of the phase rotated I-Phase signal and the phase rotated Q-Phase signal by multiplying the phases of the phase rotated I-Phase signal and the phase-rotated Q-Phase signal with an integer value to generate a phase adjusted I-Phase signal and a phase adjusted Q-Phase signal;

comparing the phase of the phase adjusted I-Phase signal with the phase of the phase adjusted Q-Phase signal to generate a phase comparison result; and generating a reference signal using the phase comparison result.

8. The demodulation method according to claim 7, further comprising:

integrating the phase comparison result to generate an integral value; and generating the reference signal using the integral value.

9. The demodulation method according to claim 8, further comprising:

adjusting a gain of the phase comparison result to generate a gain-adjusted phase comparison result; and integrating the gain-adjusted phase comparison result.

10. The demodulation method according to claim 7, further comprising:

varying the integer value.

11. The demodulation method according to claim 8, further comprising:

varying the integer value.

12. The demodulation method according to claim 9, further comprising:

varying the integer value.

13. A non-transitory computer readable medium having instructions to cause a processing unit to execute processing, the processing comprising:

rotating phases of an I-Phase signal and a Q-Phase signal in a received signal of a multilevel PSK signal using a reference signal to generate a phase-rotated I-Phase signal and a phase-rotated Q-Phase signal;

adjusting the phases of the phase rotated I-Phase signal and the phase rotated Q-Phase signal by multiplying the phases of the phase rotated I-Phase signal and the phase-rotated Q-Phase signal with an integer value to generate a phase adjusted I-Phase signal and a phase adjusted Q-Phase signal;

comparing the phase of the phase adjusted I-Phase signal with the phase of the phase adjusted Q-Phase signal to generate a phase comparison result; and generating a reference signal using the phase comparison result.

14. The non-transitory computer readable medium according to claim 13, wherein the processing further comprises:

integrating the phase comparison result to generate an integral value; and generating the reference signal using the integral value.

15. The non-transitory computer readable medium according to claim 14, wherein the processing further comprises:

adjusting a gain of the phase comparison result to generate a gain-adjusted phase comparison result; and integrating the gain-adjusted phase comparison result.

16. The non-transitory computer readable medium according to claim 13, wherein the processing further comprises:

varying the integer value.

17. The non-transitory computer readable medium according to claim 14, wherein the processing further comprises:

varying the integer value.

18. The non-transitory computer readable medium according to claim 15, wherein the processing further comprises:

varying the integer value.

* * * * *